United States Patent [19]
Sakurai

[11] Patent Number: 6,111,284
[45] Date of Patent: Aug. 29, 2000

[54] FERROELECTRIC THIN-FILM DEVICE

[75] Inventor: Atsushi Sakurai, Kyoto, Japan

[73] Assignee: Murata Manufacturing Co., Ltd., Japan

[21] Appl. No.: 09/372,848

[22] Filed: Aug. 12, 1999

[30]   Foreign Application Priority Data

Aug. 24, 1998 [JP] Japan .................................. 10-237033

[51] Int. Cl.$^7$ ................................................. H01L 27/108
[52] U.S. Cl. .......................... 257/310; 257/295; 257/325; 257/761; 257/767; 438/3; 438/240; 438/393
[58] Field of Search ..................... 257/310, 295, 257/31, 43; 365/145; 437/60; 361/305; 438/3, 240, 393

[56]   References Cited

U.S. PATENT DOCUMENTS

| | | | |
|---|---|---|---|
| 5,248,564 | 9/1993 | Ramesh | 428/688 |
| 5,293,075 | 3/1994 | Onishi | 257/769 |
| 5,508,953 | 4/1996 | Fukuda et al. | 365/114 |
| 5,567,979 | 10/1996 | Nashimoto et al. | 257/627 |
| 5,576,564 | 11/1996 | Satoh et al. | 257/295 |
| 5,578,845 | 11/1996 | Masuda et al. | 257/295 |
| 5,708,284 | 1/1998 | Onishi | 257/295 |
| 5,719,417 | 2/1998 | Roeder et al. | 257/295 |
| 5,736,759 | 4/1998 | Hausalter | 257/295 |
| 5,757,061 | 5/1998 | Satoh et al. | 252/532 |
| 5,780,886 | 7/1998 | Yamanobe | 257/295 |
| 5,811,847 | 9/1998 | Joshi et al. | 257/296 |
| 5,824,590 | 10/1998 | New | 438/393 |

FOREIGN PATENT DOCUMENTS

| | | |
|---|---|---|
| 4171976 | 6/1992 | Japan . |
| 8186182 | 7/1996 | Japan . |

*Primary Examiner*—Matthew Smith
*Assistant Examiner*—Belur Keshavan
*Attorney, Agent, or Firm*—Ostrolenk, Faber, Gerb & Soffen, LLP

[57]   ABSTRACT

A ferroelectric thin-film device comprises: a single crystal substrate; a conductive thin film formed on the single crystal substrate; and an oriented ferroelectric oxide thin film having a perovskite structure formed on the conductive thin film. The oriented ferroelectric thin film comprises a first layer having a composition changing from the interface with the conductive thin film in the thickness direction and a second layer having a constant composition formed on the first layer. The composition of the first layer and the composition of the second layer are substantially the same at the boundary between the first layer and the second layer.

12 Claims, 11 Drawing Sheets

FERROELECTRIC THIN-FILM DEVICE

BACKGROUND OF THE INVENTION

1. Field of the Invention

The present invention relates to ferroelectric thin-film devices and methods for making the same, and particularly relates to a ferroelectric thin-film device, which is applicable to not only capacitors for DRAM (dynamic random access memory) and ferroelectric RAM but also pyroelectric elements, microactuators, thin film capacitors and compact piezoelectric elements, and relates to a method for making the same.

2. Description of the Related Art

Recently, the formation of epitaxial thin films on single crystal substrates has been intensively studied regarding lead-based perovskite compounds, such as $PbTiO_3$, (Pb,La)$TiO_3$ ($Pb_{1-x}La_xTiO_3$, hereinafter abbreviated as PLT), Pb(Zr,Ti)$O_3$ ($PbZr_yTi_{1-y}O_3$, hereinafter abbreviated as PZT), (Pb,La)(Zr,Ti)$O_3$ ($Pb_{1-x}La_xZr_yTi_{1-y}O_3$, hereinafter abbreviated as PLZT) and Pb(Mg,Nb)$O_3$ ($PbMg_zNb_{1-z}O_3$, hereinafter abbreviated as PMN). This is because when a lead-based perovskite compound having large residual polarization, such as PZT or PLZT, is epitaxially grown, spontaneous polarization can be unified in one direction so that larger polarizability and switching characteristics are achieved, and application to high-density recording media will become promising.

Uses in which such spontaneous polarization is unified in one direction along the thickness, however, requires a metal-ferroelectric-metal (MFM) structure in which the ferroelectric thin film is sandwiched between conductive (electrode) layers on a substrate.

Generally, when a thin film of a lead-based perovskite compound is formed, lead is likely evaporated from the deposited thin film during its formation. As a result, the composition of the thin film often deviates from the intended composition. In order to cope with the problem, lead is supplied in an amount which is larger than the stoichiometric ratio in raw materials in the method for preventing such a change in composition. However, according to this method, excess Pb is oxidized to form PbO. Since the lattice constant of PbO is substantially equal to the lattice constant of the lead-based perovskite compound, PbO also is epitaxially grown under the conditions for epitaxial growth of the lead-based perovskite compound. Thus, the epitaxial growth of the lead-based perovskite compound is inhibited, resulting in deterioration of crystallinity and the morphology of the surface.

SUMMARY OF THE INVENTION

The present invention can solve the aforementioned problem and provides a ferroelectric thin-film device having a ferroelectric thin film of a perovskite oxide with high orientation and a method for producing the ferroelectric thin-film device.

The ferroelectric thin-film device comprises a single crystal substrate; a conductive thin film formed on the single crystal substrate; and an oriented ferroelectric oxide thin film having a perovskite structure formed on the conductive thin film. The oriented ferroelectric thin film comprises a first layer having a composition changing from the interface with the conductive thin film in the thickness direction and a second layer having a constant composition formed on the first layer. The composition of the first layer and the composition of the second layer are substantially the same at the boundary between the first layer and the second layer. There may be no distinct interface between the layers.

The oriented ferroelectric thin film is preferably a Pb(Zr,Ti)$O_3$-based thin film, and the Zr content in the first layer gradually increases from the interface with the conductive thin film in the thickness direction, while the Zr content in the second layer is constant.

According to the present invention, using conductive materials and ferroelectric materials having similar lattice constants, a conductive thin film is formed on a single crystal substrate and a ferroelectric thin film including a first layer having a changing composition and a second layer having a constant composition is formed thereon. The resulting ferroelectric thin film has high orientation and extremely reduced crystal defects. Thus, original characteristics of the materials are maintained. Expected applications of the ferroelectric thin-film device are pyroelectric devices, microactualtors, thin film capacitors and compact piezoelectric devices, in addition to DRAM and FeRAM.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
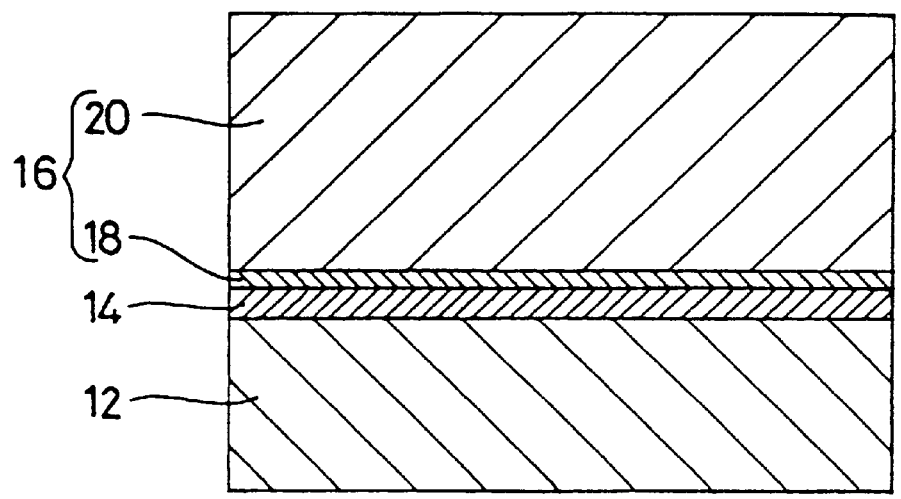
FIG. 1 is a schematic cross-sectional view of an embodiment of a ferroelectric thin-film device of the present invention.

A ferroelectric thin-film device comprises according to an preferred embodiment of the present invention comprises a single crystal substrate, a conductive thin film formed on the single crystal substrate and an oriented ferroelectric oxide thin film having a perovskite structure formed on the conductive thin film. The oriented ferroelectric thin film includes a first layer having a composition changing from the interface with the conductive thin film in the thickness direction and a second layer having a constant composition formed on the first layer, and the composition of the first layer and the composition of the second layer are substantially the same at the boundary between the first layer and the second layer.

In such a ferroelectric thin-film device, preferably, the oriented ferroelectric thin film is a Pb(Zr,Ti)O$_3$-based thin film, and the Zr content in the first layer gradually increases from the interface with the conductive thin film toward the interface with the second layer in the thickness direction. The Zr content in the second layer is constant.

In addition, the Pb(Zr,Ti)O$_3$-based thin film used may be represented by the general formula (Pb$_{1-x}$M$_x$)(Zr$_y$Ti$_{1-y}$)O$_3$, wherein M is at least one element selected from the group consisting of Li, La, Na, Mg, Ca, Sr, Ba and Bi, $\leq x \leq 0.2$ and $0.05 \leq y \leq 0.6$.

Furthermore, it is preferable that y increases by about 0.001 to 0.1 per 1 nm of the thickness from the interface with the conductive thin film in the thickness direction.

Preferably, the first layer has a thickness in a range of about 5 nm to 100 nm.

The single crystal substrate may comprise any one of Si, MgO, SrTiO$_3$, MgAl$_2$O$_3$, Al$_2$O$_3$ and LaAl$_2$O$_3$.

The conductive thin film may contain any one of Au, Pt, Pd, Rh, Ir and TiN as a major component.

Preferably, the oriented ferroelectric thin film is epitaxially grown so that the c axis is oriented perpendicularly to the single crystal substrate.

The aforementioned device can be produced by forming a conductive thin film on a single crystal substrate and forming an ferroelectric oxide thin film having a perovskite structure on the conductive thin film. Forming the ferroelectric thin film comprises a step for forming a first layer having a composition changing from the interface with the conductive thin film in the thickness direction on the conductive thin film by supplying raw materials for the ferroelectric thin film while varying the ratio of the raw materials and a step for forming a second layer on the first layer being supplying the raw materials with a constant ratio, the composition of the first layer is substantially equalized to the composition of the second layer at the boundary between the first layer and the second layer.

The oriented ferroelectric thin film is preferably a Pb(Zr,Ti)O$_3$-based thin film, and the first layer is formed so that the Zr content gradually increases from the interface with the conductive thin film in the thickness direction.

The ferroelectric thin film may be formed, for example, by a chemical vapor deposition process.

When the first layer of the oriented ferroelectric thin film is grown, the composition of the material of the first layer is selected so that the material has small lattice misfit to the conductive thin film. Next, the composition of the material is gradually changed to the required final composition of the ferroelectric thin film, and then a dielectric material having a constant composition is deposited as the second layer.

Since the composition of the first layer is gradually changed, a constant compressive stress is applied to the second layer and a 90° domain will be barely formed in the epitaxial second layer. In addition, since the composition of the first layer is gradually changed, the stress is not excessive and stress relaxation due to occurrence of misfit transition is avoided. Thus, the stress is effectively propagated.

When a Pb(Zr,Ti)O$_3$-based thin film is used so that the Zr component in the first layer is gradually increased from the interface with the conductive thin film in the thickness direction and so that the Zr component in the second layer is constant, the PZT can be grown on the conductive thin film while suppressing the deposition of PbO, suppressing formation of a 90° domain and improving c-axis orientation.

Preferable lead-based perovskite compounds are represented by the general formula (Pb$_{1-x}$M$_x$)(Zr$_y$Ti$_{1-y}$)O$_3$, wherein M is at least one element selected from the group consisting of Li, La, Na, Mg, Ca, Sr, Ba and Bi, x and y satisfy the relationships $0 \leq x \leq 0.2$ and $0.05 \leq y \leq 0.6$. The value of y is limited to about 0.05 or more because epitaxial growth does not satisfactory proceed due to a large change in lattice constant of the lead perovskite compound at a value of less than about 0.05. Furthermore, the value of y is limited to about 0.6 or less because crystallinity is decreased due to phase transition at a value of greater than about 0.6.

In the ferroelectric thin film material represented by the general formula (Pb$_{1-x}$M$_x$)(Zr$_y$Ti$_{1-y}$)O$_3$, the change in y in the first layer is limited to 0.001 to 0.1 per 1 nm of the thickness because a change of less than about 0.001 is significantly small and is not practical. When the change in y is greater than about 0.1, epitaxial growth is inhibited due to the excessively large change.

The thickness of the first layer is limited in a range of about 5 nm to 100 nm because a sufficient stress is not applied to the second layer at a thickness of less than about 0.5 nm and a thickness of the first layer of greater than about 100 nm is excessively large and is not practical.

Preferably, the single crystal substrate comprises any one of Si, MgO, SrTiO$_3$, MgAl$_2$O$_3$, Al$_2$O$_3$ and LaAl$_2$O$_3$. Since these have lattice constants which are substantially equal to the lattice constant of the lead-based perovskite oxide, epitaxial growth of the lead-based perovskite oxide is facilitated.

Preferably, the conductive thin film contains one of Au, Pt, Pd, Rh, Ir and TiN as a major component. Since these materials have lattice constants which are substantially equal to the lattice constant of the lead-based perovskite oxide, epitaxial growth of the lead-based perovskite oxide is facilitated. Furthermore, these are stable under the high-temperature, high-oxygen-partial-pressure conditions for depositing the lead-based perovskite oxide.

FIG. 1 is a schematic cross-sectional view of a ferroelectric thin-film device of the present invention. A ferroelectric thin-film device 10 includes a single crystal substrate 12. As the single crystal substrate 12, for example, a MgO(100) single crystal substrate is used. The single crystal substrate 12, however, is not limited to this, and MgO(111) and MgO(110) also are usable. These single crystal substrates can be used when the miscut angle is 5% or less. Further usable single crystal substrates 12 include Si, SrTiO$_3$, MgAl$_2$O$_3$, Al$_2$O$_3$ and LaAl$_2$O$_3$.

A conductive thin film 14 is formed on the single crystal substrate 12. As a conductive thin film 14, for example, Pt is used. It may be formed by, for example, a radiofrequency (RF) sputtering process, a direct current (DC) sputtering process, an ion beam sputtering process or an electron cyclotron resonance (ECR) sputtering process. Usable materials for the conductive thin film 14 are, for example, Au, Pt, Pd, Rh, Ir and TiN.

Figure 2:
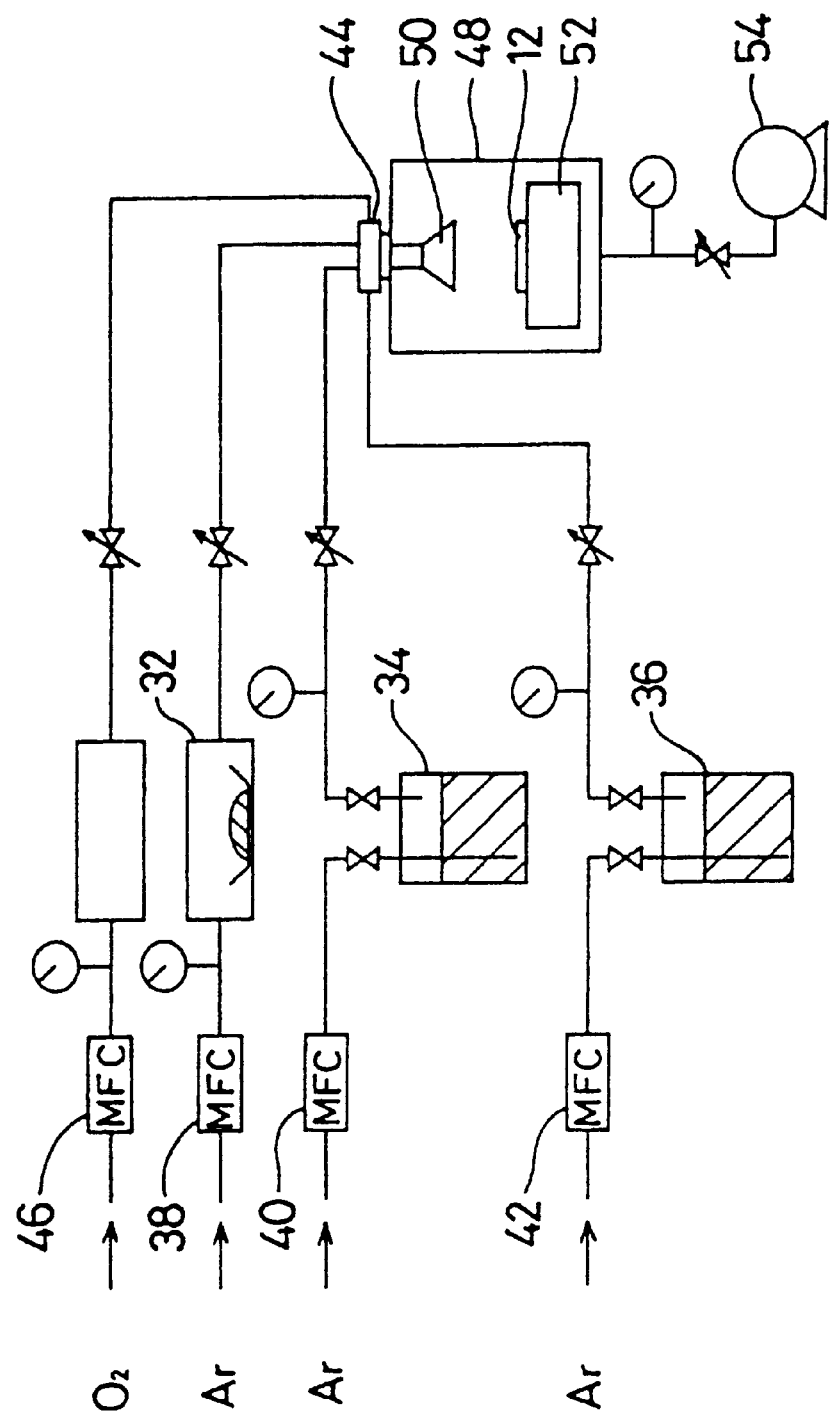
FIG. 2 is a schematic view of a MOCVD system used in production of ferroelectric thin-film devices of the present invention.

A highly oriented ferroelectric thin film 16 of an oxide having a perovskite structure is formed on the conductive thin film 14. The ferroelectric thin film 16 includes a first layer 18 and a second layer 20. The first layer 18 is formed on the conductive thin film 14 so that the composition gradually changes. The second layer 20 is formed on the first layer 18 so that the composition is constant. An exemplary material for the ferroelectric thin film 16 is Pb(Zr,Ti)O$_3$ (PZT). In this case, the first layer 18 is formed so that the Zr component gradually increases from the interface with the conductive thin film 14 in the thickness direction. Furthermore, it is formed so that the composition of the uppermost section of the first layer 18 is substantially equal to the composition of the second layer 20. The ferroelectric thin film 16 is formed by, for example, a chemical vapor deposition process, such as a metal-organic CVD (MOCVD) process, as shown in FIG. 2.

The MOCVD system 30 includes a solid vaporizer 32 and liquid vaporizers 34 and 36. The solid vaporizer 32 contains a solid lead material and the liquid vaporizers 34 and 36 contain a liquid zirconium material and a liquid titanium material, respectively. The solid vaporizer 32 and the liquid vaporizers 34 and 36 are connected to mass flow controllers (MFCs) 38, 40, and 42, respectively. Argon carrier gas is supplied through these MFCs 38, 40 and 42. The solid vaporizer 32 and the liquid vaporizers 34 and 36 also are connected to a mixer 44. Oxygen gas is supplied to the mixer 44 from another MFC 46. The mixer 44 is connected to a blowing nozzle 50 provided in a vacuum chamber 48. A heater 52 is provided in the vacuum chamber 48 and a single crystal substrate 12 provided with a conductive thin film 14 is placed on the heater 52. The vacuum chamber 48 is connected to a vacuum pump 54.

In the MOCVD system 30, individual materials are heated in the solid vaporizer 32 and the liquid vaporizers 34 and 36, while argon gas is supplied from the MFCs 38, 40 and 42. These materials are vaporized and introduced into the mixer 44. In the mixer 44, these vaporized materials are mixed and blown onto the single crystal substrate 12 from the blowing nozzle 50, together with oxygen gas supplied from the MFC 46. The interior of the vacuum chamber 48 is evacuated by the vacuum pump 54 and the single crystal substrate 12 is heated by the heater 52. In such a state, a mixture of the vaporized materials is blown onto the conductive thin film 14 formed on the single crystal substrate 12 to form a ferroelectric thin film 16 on the conductive thin film 14.

The argon gas flow rates supplied to these vaporizers 32, 34 and 36 are regulated so that the composition of the vaporized materials supplied to the vacuum chamber 48 is controlled. When the argon gas flow rates are changed during the deposition of the ferroelectric thin film 16 on the conductive thin film 14, the composition of the first layer 18 will be changed in the thickness direction. When the second layer 20 is formed, the flow rates are controlled so that the composition of the vaporized materials is constant. When PZT is used for the ferroelectric thin film 16, the first layer 18 is formed so that the Zr component is low at the interface with the conductive thin film 14 and is gradually increased in the thickness direction. The first layer 18 is formed so that it has a thickness of about 5 nm to 100 nm. The second layer 20 is formed so that the Zr component is constant and is substantially equal to the component at the interface with the first layer 18.

The composition of the ferroelectric thin film 16 also is adjustable by the vaporization temperatures and pressures for materials, in addition to the argon gas flow rates. When the composition is change by the argon gas flow rates, the flow rates for the lead material and the zirconium material may be changed or the flow rates for the lead material and the titanium material may be changed. Instead of the system for supplying the lead, zirconium and titanium materials from the different vaporizers, a mixture of the lead material and the zirconium material or a mixture of the lead material and the titanium material may be used. These materials may be supplied as solutions using proper solvents for achieving the same purpose.

The composition of the first layer 18 may be stepwise or continuously changed. When the ferroelectric thin film 16 having a composition represented by the general formula (Pb$_{1-x}$M$_x$) (Zr$_y$Ti$_{1-y}$)O$_3$ is formed, it is preferable that a change in y in the first layer 18 is within a range of about 0.001 to 0.1 per 1 nm of the thickness and the change is gradual. The ferroelectric thin film 16 also may be formed by a plasma enhanced CVD process, a laser enhanced CVD process, a laser ablation process, a multiple sputtering process, a multiple evaporation process and a molecular beam epitaxy (MBE) process, instead of the MOCVD process.

In the ferroelectric thin-film device 10, materials having substantially the same lattice constant are selected for the single crystal substrate 12, the conductive thin film 14 and the ferroelectric thin film 16 so that epitaxial growth is achieved by, for example, a chemical vapor deposition process. Since the first layer 18 is formed so that the composition is gradually changed, misfit between the conductive thin film 14 and the first layer 18 can be reduced and misfit between the first layer 18 and the second layer 20 also can be reduced. Thus, the deposition of the desired film is achieved while deposition of an undesired film is prevented.

When a platinum thin film is formed as the conductive thin film 14 and when a PZT thin film is grown as the ferroelectric thin film 16, the zirconium content in the PZT thin film is suppressed at the initial stage of the deposition of the ferroelectric thin film 16 so that the lattice constant is decreased and so that misfit between the substrate or electrode and the ferroelectric material is decreased. In addition, the misfit between PZT and platinum is less than the misfit between PbO and the substrate, resulting in predominant epitaxial growth of PZT and suppression of growth of PbO as a result. The second layer 20 having a composition which is substantially equal to the composition of the first layer 18 at the interface and is constant is formed on the first layer 18. Thus, compressive stress is applied to the second layer 20, suppressing formation of a 90° domain and improving c-axis orientation. Since the composition of the first layer 18 is gradually changed, the stress is not excessive and stress relaxation due to occurrence of misfit transition is avoided. Thus, the stress is effectively propagated to the second layer 20.

Although a boundary layer of ZrO$_2$ is readily formed at the interface with the conductive thin film 14, the zirconium content is small at the boundary layer. Thus, growth of ZrO$_2$ can be suppressed. Since roughening of the surface of the ferroelectric thin film due to the growth of PbO is avoided, micro-processability is improved. Since all of the films are formed by epitaxial growth, mutual diffusion at the interfaces between these films does not substantially occur and the films have high thermal stability.

The method for making the ferroelectric thin-film device 10 in the present invention can form high-quality epitaxial thin films with extremely decreased crystal defects, and thus the method does not cause deterioration of original characteristics of the materials. Furthermore, the method is capable of epitaxially growing a highly oriented lead-based perovskite oxide ferroelectric thin film 16 on a single crystal substrate 12, that is not achieved by any conventional method. Expected applications of the method are pyroelectric devices, microactualtors, thin film capacitors and compact piezoelectric devices, in addition to DRAM and FeRAM.

EXAMPLE 1

As a single crystal substrate 12, MgO(100) having a diameter of 2 inches (5.08 cm) was used. The MgO(100) substrate was cleaned in an organic solvent, such as acetone or ethanol, by ultrasonic agitation. Next, a platinum thin film having a thickness of 100 nm was formed on the MgO substrate using a RF magnetron sputtering system under a total pressure of 2 mTorr (oxygen partial pressure: 0.2 mTorr) at a substrate temperature of 600° C.

Figure 3:
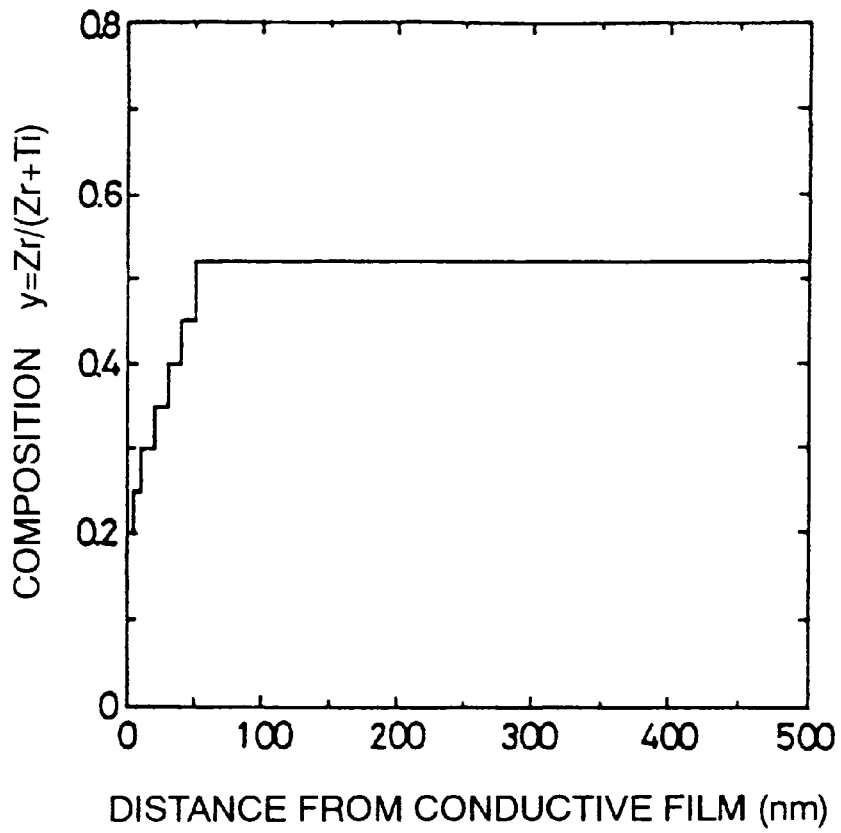
FIG. 3 is a graph showing the change in composition of the ferroelectric thin-film device prepared in Example 1.
Figure 4:
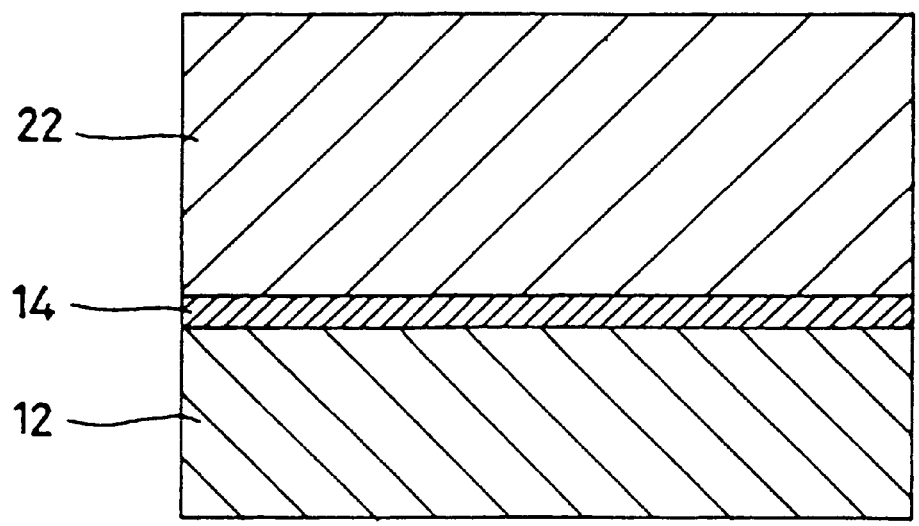
FIG. 4 is a schematic cross-sectional view of the ferroelectric thin-film device prepared in Comparative Example 1.

Using a MOCVD system shown in FIG. 2, a $Pb(Zr_{0.52}Ti_{0.48})O_3$, PZT, thin film having a thickness of 400 to 600 nm was epitaxially grown under a total pressure of 10 Torr (oxygen partial pressure: 5 Torr) at a substrate temperature of 700° C. Precursors for lead, zirconium and titanium, $Pb(DPM)_2$, $Zr(O-T-C_4H_9)$ and $Ti(O-i-C_3H_7)_4$, respectively, were used. The detailed conditions for preparing the PZT thin film are shown in Table 1. As shown in FIG. 3, the composition of the first layer was controlled so that the Zr component stepwise increases from the platinum electrode side in the thickness direction.

TABLE 1

| Item | Vaporization Temperature | Flow Rate of Carrier Gas | Pressure of Vaporizer |
|---|---|---|---|
| Pb Material | 130° C. | 200 SCCM (Ar) | 10 Torr |
| Zr Material | 35° C. | 50 SCCM (Ar) | 10 Torr |
| Ti Material | 50° C. | 50 SCCM (Ar) | 100 Torr |
| $O_2$ Gas | — | 500 SCCM | — |

COMPARATIVE EXAMPLE 1

As in Example 1, a platinum thin film having a thickness of 100 nm was epitaxially grown on the MgO(100) substrate by a RF magnetron sputtering process under a total pressure of 2 mTorr (oxygen partial pressure: 0.2 mTorr) at a substrate temperature of 600° C. By a total-pressure MOCVD process, a $Pb(Zr_{0.52}Ti_{0.48})O_3$, PZT, thin film having a thickness of 400 to 500 nm was grown on the platinum thin film under a total pressure of 10 Torr (oxygen partial pressure: 5 Torr) at a substrate temperature of 600° C. In Comparative Example 1, a first layer having a changing composition was not formed, and a dielectric thin film 22 having a constant composition was formed on the platinum thin film 14.

Figure 5:
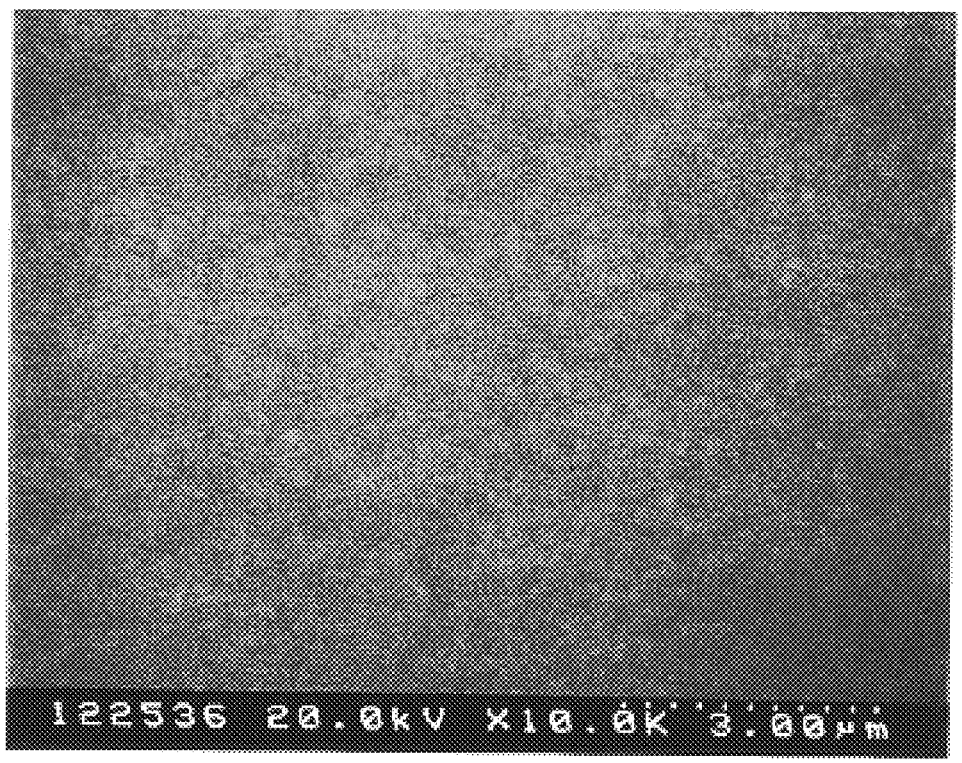
FIG. 5 shows a surface of the ferroelectric thin-film device prepared in Example 1.
Figure 6:
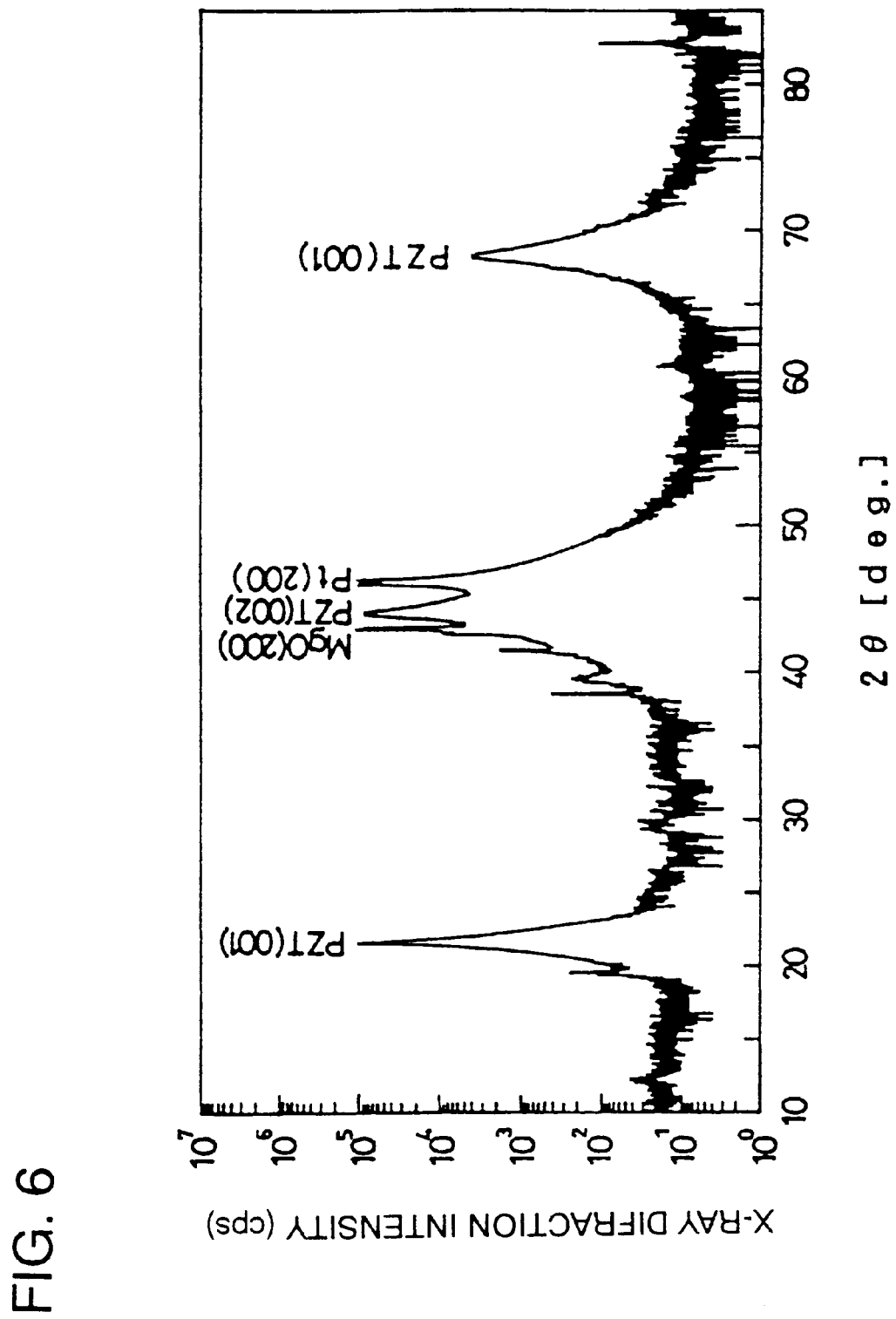
FIG. 6 shows an X-ray diffraction pattern of the ferroelectric thin-film device prepared in Example 1.

The surface state of the PZT film formed in Example 1 is shown in FIG. 5. FIG. 5 shows that the PZT film has a smooth surface. FIG. 6 is an X-ray diffraction pattern of the PZT/Pt/MgO thin films formed in Example 1. FIG. 6 demonstrates that only PZT having a perovskite structure is grown and is (001)-oriented. Since no PZT(100) peak is observed, the 90° domain is not substantially formed. In addition, no PbO peak is observed.

Figure 7:
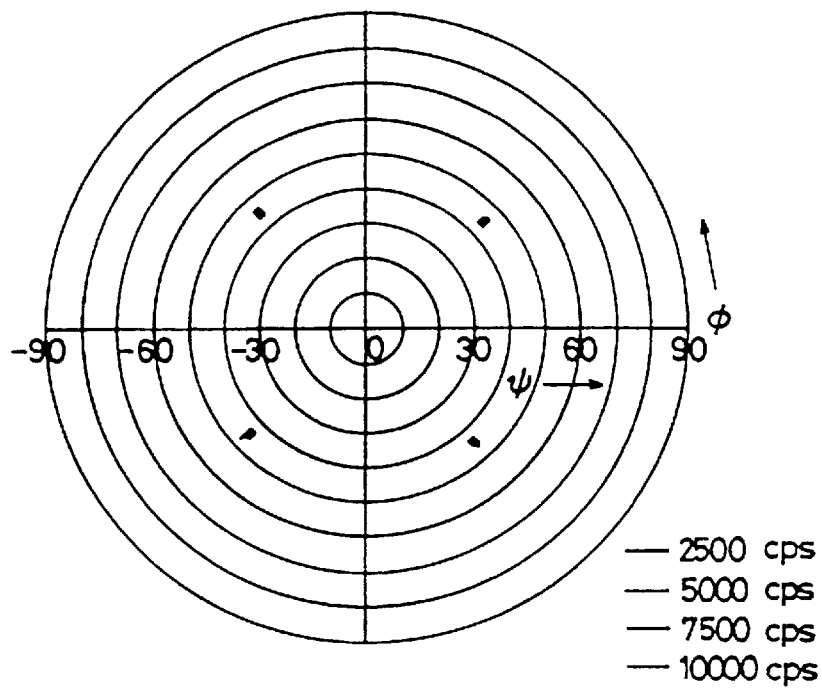
FIG. 7 is a pole figure diagram of a PZT thin film of the ferroelectric thin-film device prepared in Example 1.
Figure 8:
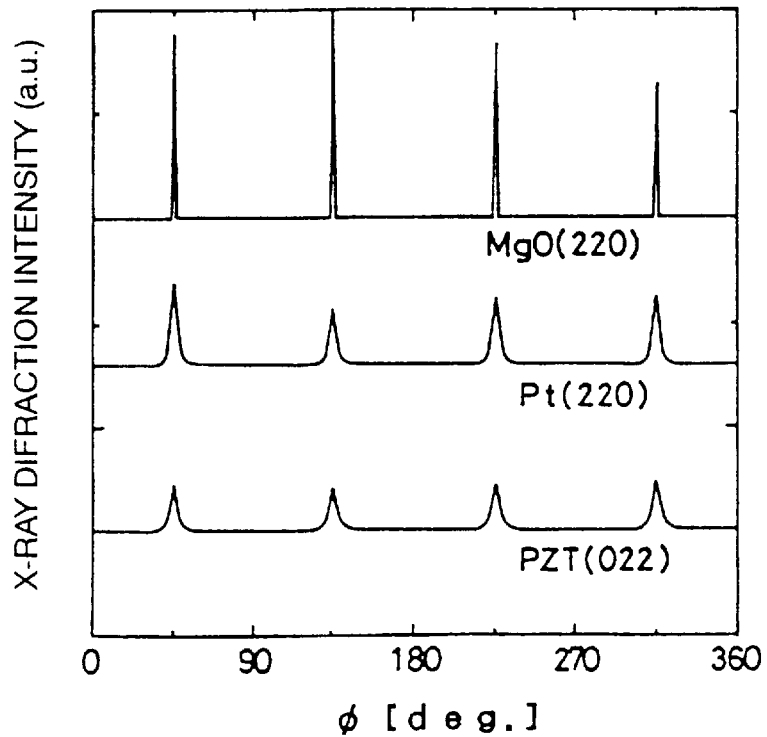
FIG. 8 is a φ scan diagram of a PZT thin film of the ferroelectric thin-film device prepared in Example 1.

FIG. 7 shows the results of pole figure analysis of PZT(022). A tetrad-symmetry Pt peak and a tetrad-symmetry PZT peak shown in FIG. 7 suggest that the platinum thin film and the PZT thin film are epitaxially grown. FIG. 8 shows the φ scan of the PZT/Pt/MgO thin film. FIG. 8 demonstrates that Pt and PZT are grown on the MgO substrate with a constant orientation relationship, that is, epitaxially grown. The half-width value (full width at half maximum) of the PZT(001) locking curve was 0.05° C.

Figure 9:
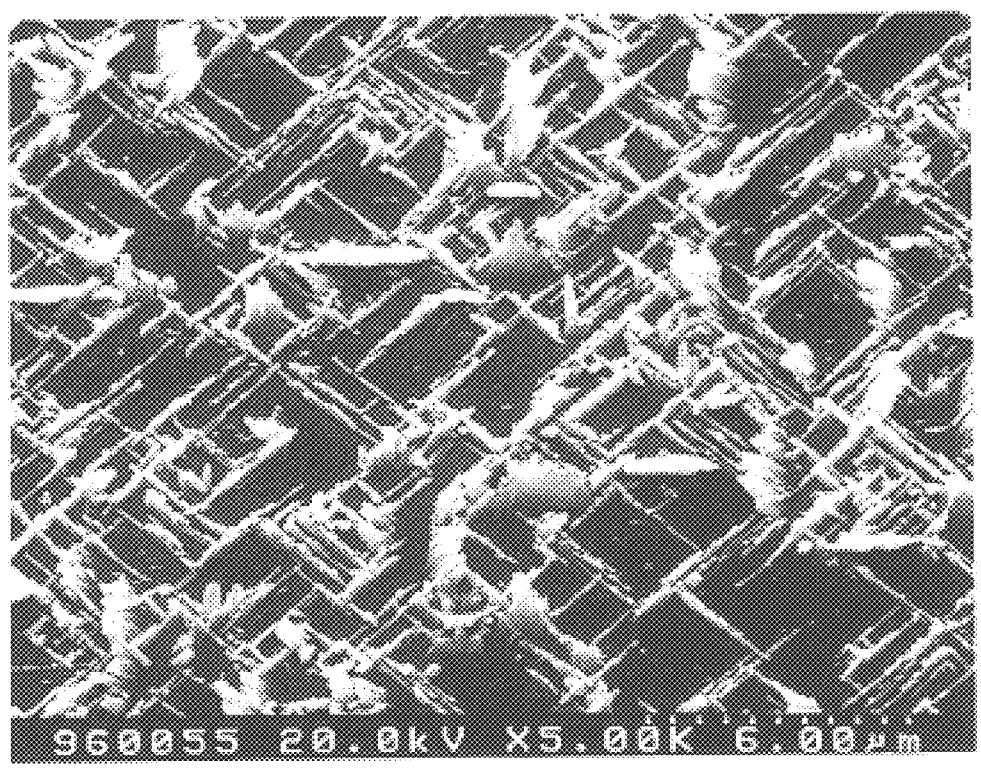
FIG. 9 shows a surface of the ferroelectric thin-film device prepared in Comparative Example 1.
Figure 10:
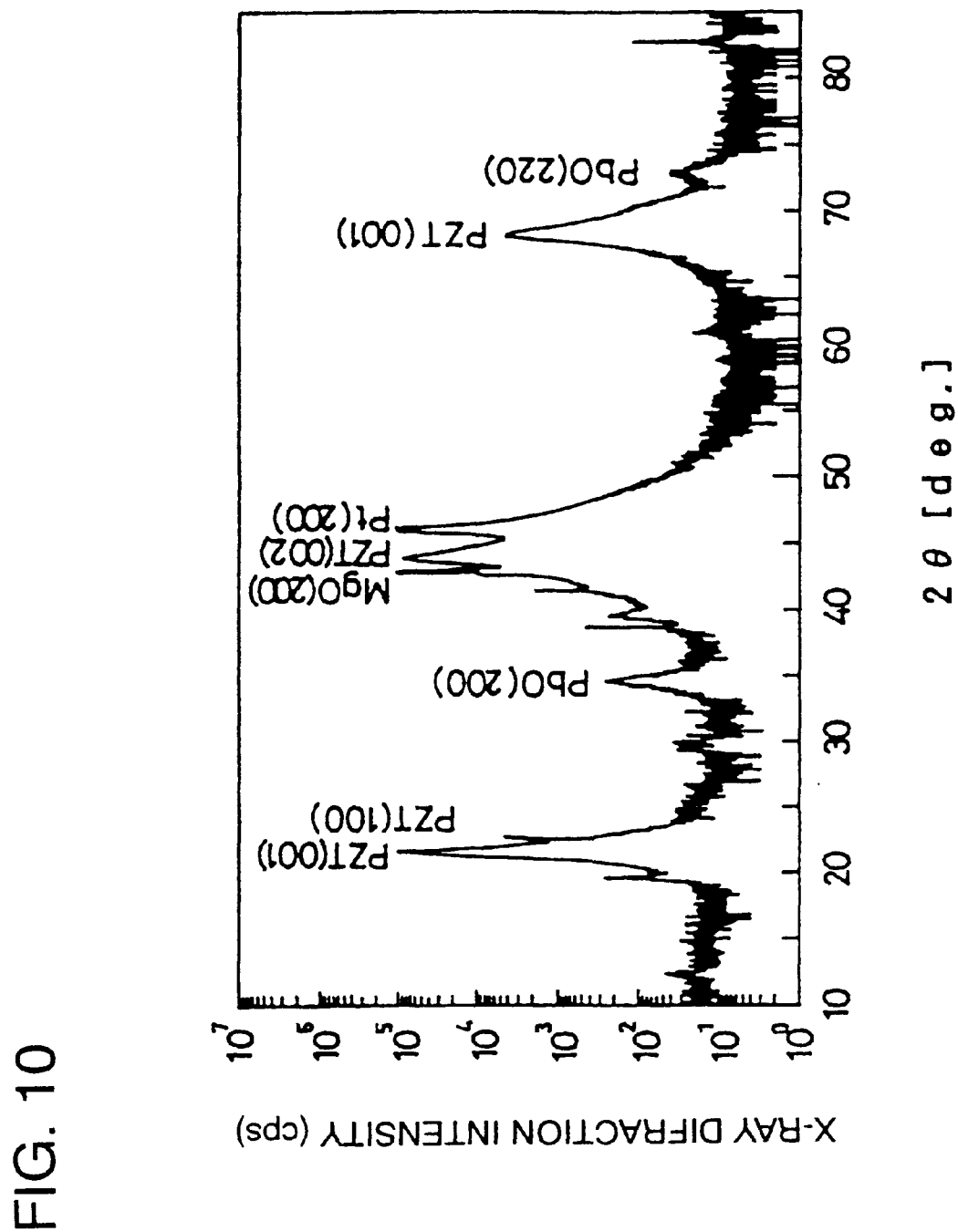
FIG. 10 shows an X-ray diffraction pattern of the ferroelectric thin-film device prepared in Comparative Example 1.

FIG. 9 shows the surface state of the PZT film formed in Comparative Example 1. FIG. 9 shows a regular pattern on the surface, that is, large unevenness and epitaxial growth of substances other than PZT. FIG. 10 shows the X-ray diffraction pattern. FIG. 10 demonstrates that the PZT thin film contains a perovskite phase but is not perfectly oriented to a specified axis due to the PZT(100) peak showing formation of a 90° domain. The PbO(200) peak also shows imperfect epitaxial growth. The half width value of the PZT(001) locking curve was 0.3° C.

Figure 11:
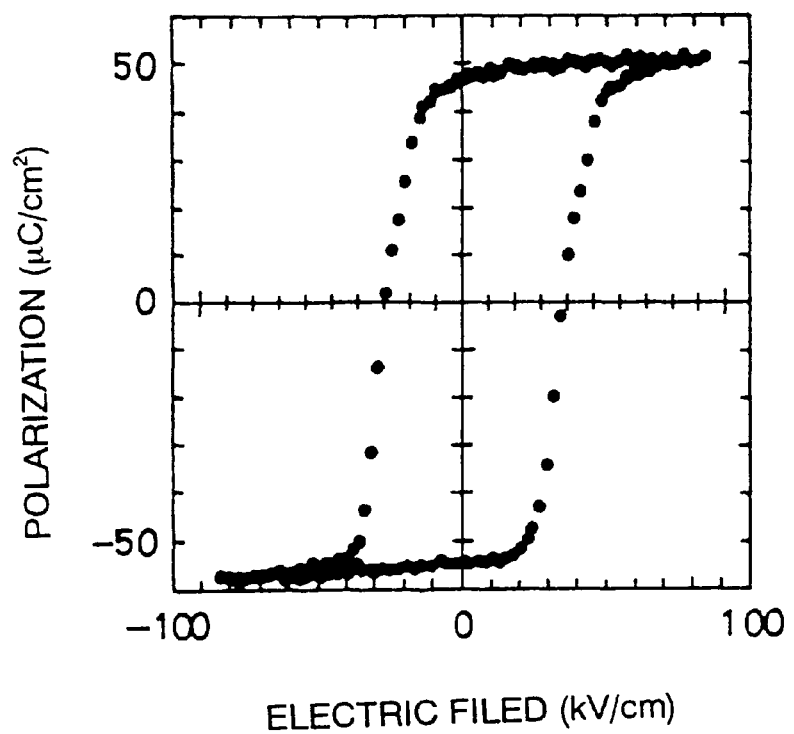
FIG. 11 is a P-E hysteresis loop diagram of the PZT thin film of a ferroelectric thin-film device prepared in Example 1.

The results of evaluation of electrical characteristics of PZT thin film devices prepared in Example 1 and Comparative Example 1 are shown in Table 2. In Table 2, tan δ and the relative dielectric constant represent the results at 1 kHz and 0.1 V. FIG. 11 shows a P-E hysteresis loop which was depicted using the epitaxial PZT thin film prepared in Example 1. These results demonstrate that the epitaxial PZT thin film prepared in Example 1 has excellent electrical characteristics.

TABLE 2

| Sample | tan δ (%) | Relative Dielectric Constant | Thickness |
|---|---|---|---|
| PZT Thin Film in Example 1 | 2.0 | 360 | 500 nm |
| PZT Thin Film in Comparative Example 1 | 4.1 | 450 | 500 nm |

EXAMPLE 2

Figure 12:
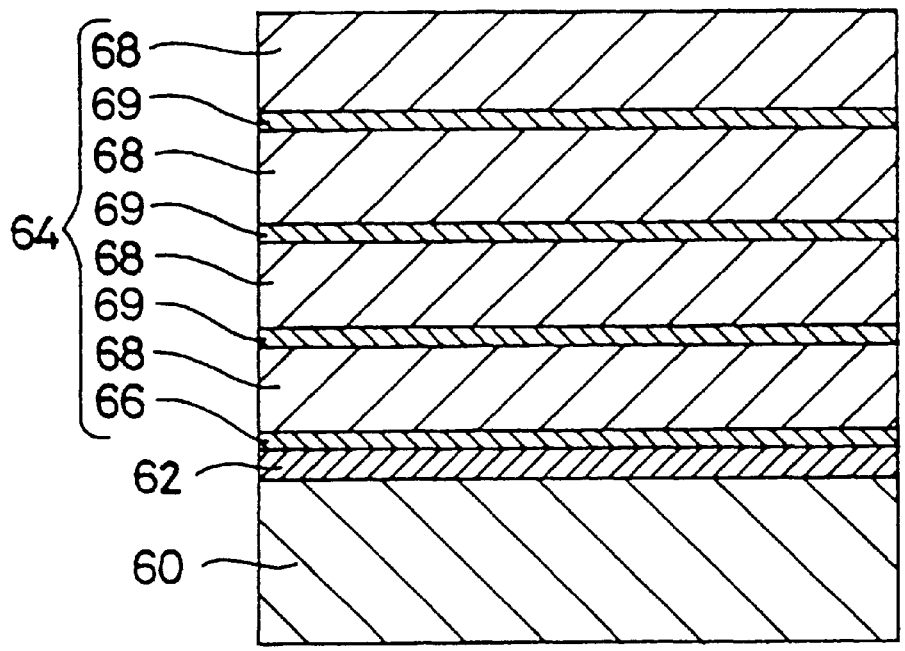
FIG. 12 is a schematic cross-sectional view of the ferroelectric thin-film device prepared in Example 2.

A $MgAl_2O_4(100)$ single crystal substrate 60 was cleaned in an organic solvent, such as acetone or ethanol, by ultrasonic agitation, and then a platinum thin film 62 having a thickness of 100 nm was formed thereon by a RF magnetron sputtering process. Next, by a RF sputtering process, a PLZT thin film 64 having a thickness of 2.5 μm was formed under a total pressure of 2 mTorr (oxygen partial pressure: 0.5 mTorr) at a substrate temperature of 600° C. As shown in FIG. 12, the PLZT thin film 64 includes a first layer 66 formed on the platinum thin film 62 and a plurality of second layers 68 and a plurality of third layers 69. The first layer 66 is the same as that explained in Example 1. That is, as illustrated in FIG. 3, the first layer 66 has the composition of $Pb_{0.8}La_{0.2}Zr_{0.2}Ti_{0.8}O_3$ at the interface with the platinum thin film 62, and the Zr content increases towards the interface with the second layer 68 in the thickness direction so that the first layer 66 has the composition of $Pb_{0.8}La_{0.2}Zr_{0.52}Ti_{0.48}O_3$ at the interface with the second layer 68. Each of the second layer 68 has a constant composition of $Pb_{0.8}La_{0.2}Zr_{0.52}Ti_{0.48}O_3$.

Figure 13:
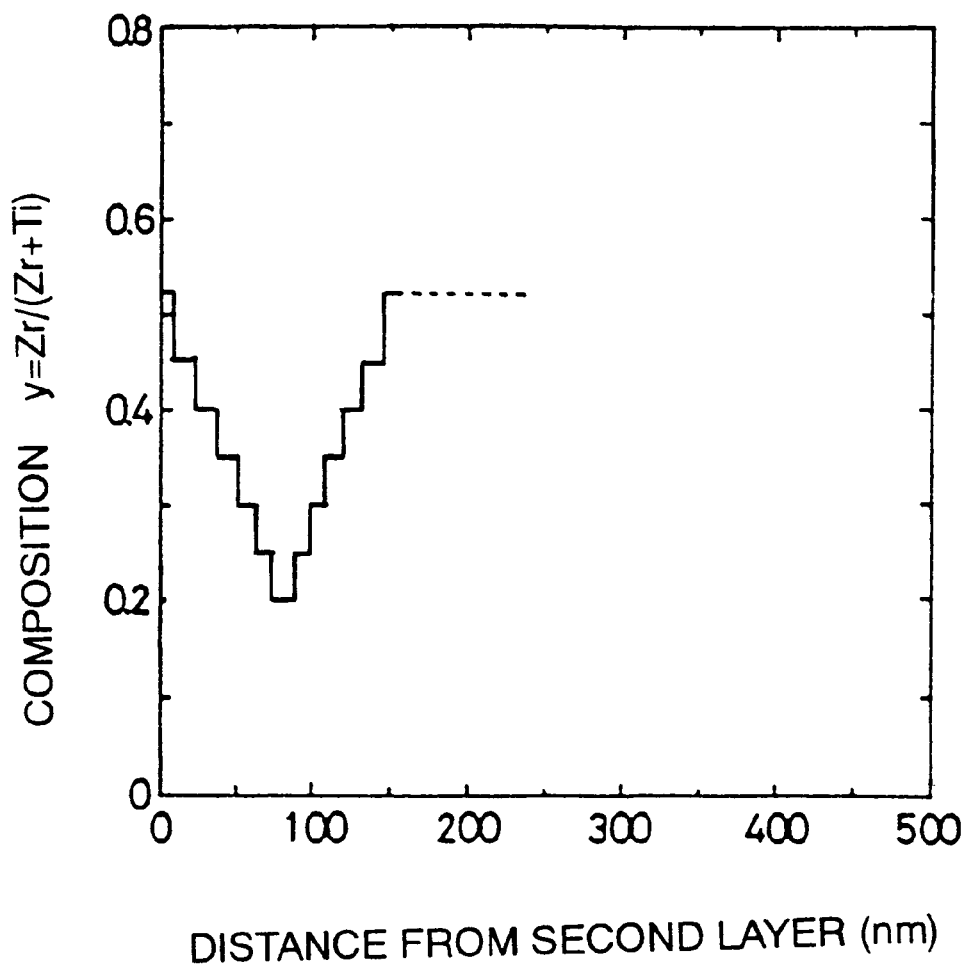
FIG. 13 is a graph showing a change in composition of the ferroelectric thin-film device prepared in Example 2.

Each of the third layers 69 has the changing composition as shown in FIG. 13. Specifically, each third layer 69 is sandwiched between the second layers 68 and Zr content is decreases from the both interface with the second layer 68 towards the middle of the third layer 69 in the thickness direction. The Zr content at the both interfaces with the second layer 68 is same as that of the second layer 68.

As explained above, although the first layer having the changing composition successfully prevents PbO from depositing, PbO tends to form in the oriented ferroelectric thin film if the ferroelectric thin film has a larger thickness. In the case, the third layers 69 formed between the second layers 68 effectively reduce the generation of the PbO.

Figure 14:
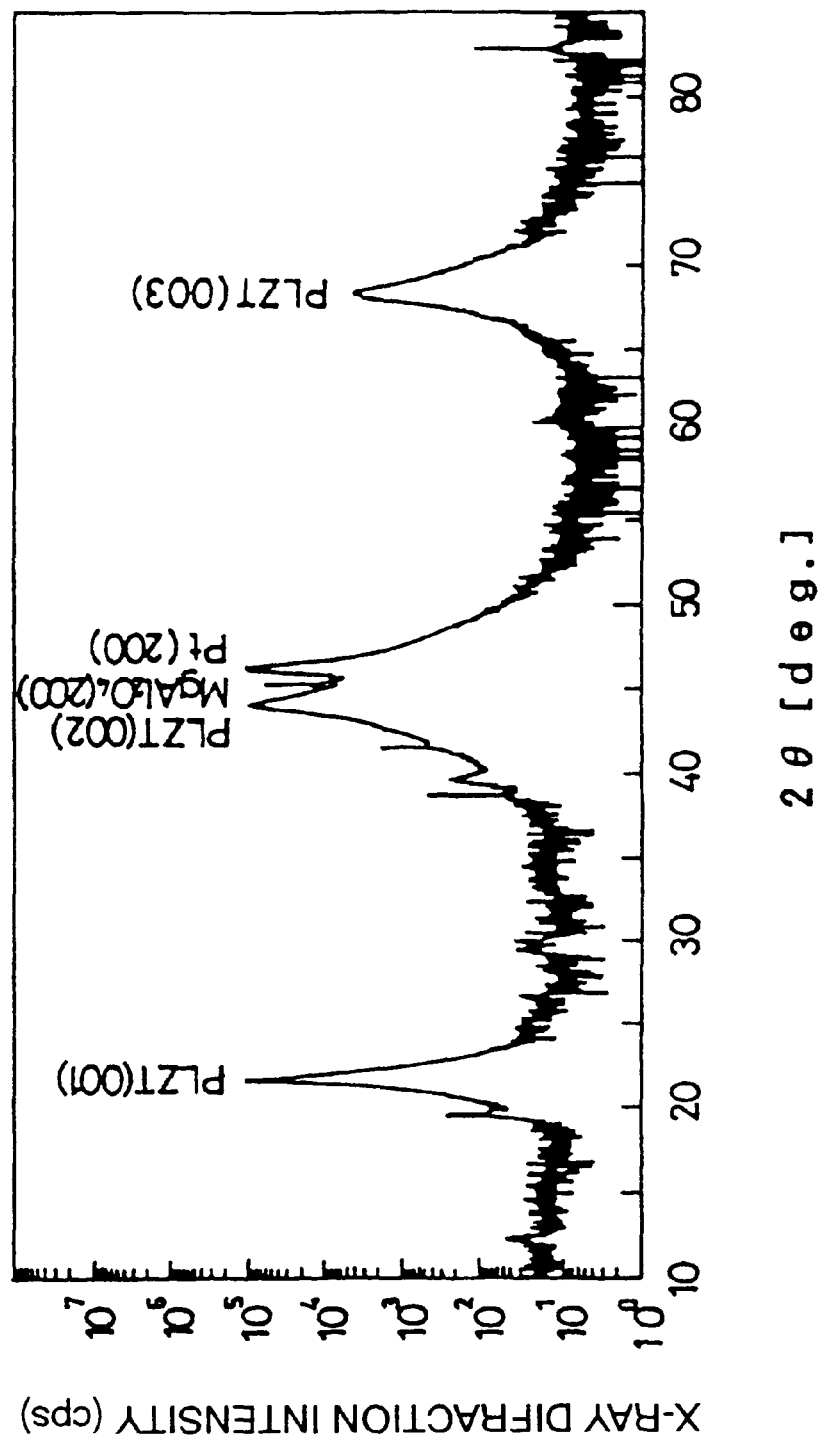
FIG. 14 shows an X-ray diffraction pattern of the ferroelectric thin-film device prepared in Example 2.

FIG. 14 is an X-ray diffraction pattern of the PLZT/Pt/$MgAl_2O_4$ thin films formed in Example 2. FIG. 14 demonstrates that PLZT having a perovskite structure is grown and is (001) oriented. The growth of other crystals is not observed. Although the thickness of the deposited film is 2.5 μm in Example 2, by overlaying a combination of a layer having a changing composition and a layer having a constant composition, the advantage is confirmed when the thickness of the deposited film is 20 μm or less.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A ferroelectric thin-film device comprising:
    a single crystal substrate;
    a conductive thin film on the single crystal substrate; and
    an oriented ferroelectric oxide thin film having a perovskite structure on the conductive thin film; the oriented ferroelectric thin film comprising a first layer having a composition which changes in the thickness direction from the interface with the conductive thin film toward a second layer and the second layer having a constant composition superimposed on the first layer, the composition of the first layer and the composition of the second layer being substantially the same at the boundary between the first layer and the second layer.

2. A ferroelectric thin-film device according to claim 1, wherein the oriented ferroelectric thin film is a Pb(Zr,Ti)O$_3$-based thin film, the Zr content in the first layer gradually increases from the interface with the conductive thin film in the thickness direction, and wherein the Zr content in the second layer is constant.

3. A ferroelectric thin-film device according to claim 2, wherein the Pb(Zr,Ti)O$_3$-based thin film is represented by the general formula (Pb$_{1-x}$M$_x$)(Zr$_y$Ti$_{1-y}$)O$_3$, wherein M is at least one element selected from the group consisting of Li, La, Na, Mg, Ca, Sr, Ba and Bi, $0 \leq x \leq 0.2$ and $0.05 \leq y \leq 0.6$.

4. A ferroelectric thin-film device according to claim 3, wherein y increases by about 0.001 to 0.1 per 1 nm of the thickness from the interface with the conductive thin film in the thickness direction.

5. A ferroelectric thin-film device according to claim 4, wherein the first layer has a thickness in a range of about 5 nm to 100 nm.

6. A ferroelectric thin-film device according to claim 5, wherein the single crystal substrate comprises Si, MgO, SrTiO$_3$, MgAl$_2$O$_3$, Al$_2$O$_3$ or LaAl$_2$O$_3$.

7. A ferroelectric thin-film device according to claim 6, wherein the conductive thin film comprises Au, Pt, Pd, Rh, Ir or TiN.

8. A ferroelectric thin-film device according to claim 7, wherein the oriented ferroelectric thin film is epitaxial and the c axis is oriented perpendicularly to the single crystal substrate.

9. A ferroelectric thin-film device according to claim 1, wherein the first layer has a thickness in a range of about 5 nm to 100 nm.

10. A ferroelectric thin-film device according to claim 1, wherein the single crystal substrate comprises Si, MgO, SrTiO$_3$, MgAl$_2$O$_3$, Al$_2$O$_3$ or LaAl$_2$O$_3$ and wherein the conductive thin film comprises Au, Pt, Pd, Rh, Ir or TiN.

11. A ferroelectric thin-film device according to claim 1, wherein the oriented ferroelectric thin film is epitaxial and the c axis is oriented perpendicularly to the single crystal substrate.

12. A ferroelectric thin-film device according to claim 1, wherein the oriented ferroelectric thin film a chemical vapor deposition process film.

* * * * *